US007232603B2

(12) United States Patent
Hessman

(10) Patent No.: US 7,232,603 B2
(45) Date of Patent: Jun. 19, 2007

(54) CUTTING TOOL INSERT

(75) Inventor: Ingemar Hessman, Sandviken (SE)

(73) Assignee: Sandvik Intellectual Property AB, Sandviken (SE)

( * ) Notice: Subject to any disclaimer, the term of this patent is extended or adjusted under 35 U.S.C. 154(b) by 0 days.

(21) Appl. No.: 11/133,173

(22) Filed: May 20, 2005

(65) Prior Publication Data
US 2006/0046100 A1 Mar. 2, 2006

(30) Foreign Application Priority Data
Jul. 12, 2004 (SE) .................................. 0401840

(51) Int. Cl.
*B32B 9/00* (2006.01)
(52) U.S. Cl. ................ 428/216; 427/419.1; 427/419.2; 427/419.7; 428/336; 428/472; 428/325; 428/697; 428/698; 428/701; 428/702
(58) Field of Classification Search ................ 428/216, 428/336, 472, 697, 698, 699, 701, 702; 427/419.1, 427/419.2, 419.7
See application file for complete search history.

(56) References Cited

U.S. PATENT DOCUMENTS

| | | | |
|---|---|---|---|
| 5,487,625 A | 1/1996 | Ljungberg et al. | |
| 5,766,782 A | 6/1998 | Ljungberg et al. | |
| 5,851,687 A | 12/1998 | Ljungberg et al. | |
| 5,861,210 A | 1/1999 | Lenander et al. | |
| 5,863,640 A | 1/1999 | Ljungberg et al. | |
| 5,945,207 A * | 8/1999 | Kutscher et al. ............ | 428/216 |
| 5,976,707 A | 11/1999 | Grab | |
| 6,589,602 B2 | 7/2003 | Kobayashi et al. | |
| 6,692,822 B2 * | 2/2004 | Andersson et al. ......... | 428/698 |

FOREIGN PATENT DOCUMENTS

| | | |
|---|---|---|
| EP | 0 736 615 | 10/1996 |
| EP | 0 753 603 | 1/2000 |
| EP | 1 253 124 A1 | 10/2002 |
| SE | 509 560 C2 | 2/1999 |
| SE | 514 177 C2 | 1/2001 |

* cited by examiner

*Primary Examiner*—Archene Turner
(74) *Attorney, Agent, or Firm*—Drinker Biddle & Reath LLP

(57) ABSTRACT

The present invention relates to a cutting tool insert for side and face milling of rolled low alloyed steel at low and at moderate cutting speeds comprising a cemented carbide body and a coating and a method for making same. The cemented carbide body comprises WC, from about 7.3 to about 7.9 wt-% Co and from about 1.0 to about 1.8 wt-% cubic carbides of Ta and Nb and a highly W-alloyed binder phase with a CW-ratio of from about 0.86 to about 0.94. The coating comprises:
- a first (innermost) layer of $TiC_xN_yO_z$ with a thickness of from about 0.1 to about 2 μm, and with equiaxed grains with size less than about 0.5 μm
- a layer of $TiC_xN_yO_z$ with a thickness of from about 2 to about 10 μm with columnar grains with a diameter of about less than about 5 μm
- a layer of $TiC_xN_yO_z$ with a thickness of 0.1-2 μm and with equiaxed or needlelike grains with size less than about 0.5 μm
- an outer layer of a smooth, textured, finegrained α-$Al_2O_3$ layer with a thickness of from about 2 to about 10 μm.

The invention also relates to the use of such a cutting tool insert for side and face milling of rolled low alloyed steel at low and moderate cutting speeds.

21 Claims, No Drawings

CUTTING TOOL INSERT

BACKGROUND OF THE INVENTION

The present invention relates to a chamfering cutting tool insert particularly useful for the milling of plates intended for manufacturing of tubes for pipelines for crude oil, natural gas or the like.

Pipelines are frequently used to transport fluid products for substantial distances, with oil and gas transmission pipelines being but two well-known examples. Such pipelines are generally constructed of individual pipe sections that are joined together by welding.

Individual pipe sections are formed from huge plates on the order of 4 m×12 m with a thickness of 25 mm, of low alloyed steel and welded longitudinally.

Separate lengths of pipe are typically interconnected by electric-arc welding and many types of welding techniques are used or proposed in the art for that purpose.

The plates are machined to obtain a chamfer suitable for the subsequent welding of the individual sections as well as the welding together of separate pipe sections.

The machining of the plates to obtain the desired character is made in large milling machines with cutters having a diameter of from about 600 to 1200 mm, provided with 40-80 inserts of rectangular shape tangentially mounted with dimensions of 32×20×8 mm. Normally inserts of coated cemented carbide grade tools are used.

It is important to obtain long tool life and minimise the tool change frequency in order to reduce the cost. The criteria for the operation are sufficient surface finish and little or no structure deformation. It is important to create a surface finish that does not disturb the welding process.

OBJECT AND SUMMARY OF THE INVENTION

It is an object of the present invention to provide a cutting tool insert particularly useful for the chamfer milling of steel plates for oil pipelines and similar.

In one aspect of the invention, there is provided a cutting tool insert comprising a cemented carbide body and a coating said cemented carbide body comprising WC, from about 7.3 to about 7.9 wt-% Co and from about 1.0 to about 1.8 wt-% cubic carbides of Ta and Nb, a highly W-alloyed binder phase with a CW-ratio of from about 0.86 to about 0.94, and an edge radius of from about 20 to about 45 µm, said coating comprising a first (innermost) layer of $TiC_xN_yO_z$ with a thickness of from about 0.1 to about 2 µm, and with equiaxed grains with size less than about 0.5 µm a layer of $TiC_xN_yO_z$ with a thickness of from about 2 to about 10 µm with columnar grains with a diameter of less than about 5 µm a layer of $TiC_xN_yO_z$ with a thickness of from about 0.1 to about 2 µm and with equiaxed or needlelike grains with size less than about 0.5 µm an outer layer of a smooth, textured, finegrained $\alpha\text{-}Al_2O_3$ layer with a thickness of from about 2 to about 10 µm.

In another aspect of the invention, there is provided a method of making a cutting tool insert comprising a cemented carbide body and coating the cemented carbide body having a composition of from about 7.3 to about 7.9 wt % Co, from about 1.0 to about 1.8 wt % cubic carbides and balance WC with a content of Ti on a level corresponding to a technical impurity, the average grain size of the WC being in the range of from about 1.5 to about 2.5 µm, and hardness from about 1500 to about 1600 HV and a CW-ratio of from about 0.84 to about 0.94, and with an edge radius of from about 20 to about 45 µm comprising coating said body with a first (innermost) layer of $TiC_xN_yO_z$ with x+y+z=1 with a thickness of from about 0.1 to about 2 µm, and with equiaxed grains with size less than about 0.5 µm using known CVD-methods a layer of $TiC_xN_yO_z$ with x+y+z=1 with a thickness of from about 2 to about 10 µm with columnar grains and with a diameter of about <5 µm, deposited either by MTCVD-technique (using acetonitrile as the carbon and nitrogen source for forming the layer in the temperature range of 700-900° C.) or by high temperature CVD-technique (1000-1100° C.), the process conditions being selected to grow layers with columnar grains.

a layer of $TiC_xN_yO_z$ with x+y+z=1 with z<0.5, with a thickness of from about 0.1 to about 2 µm and with equiaxed or needlelike grains with size less than about 0.5 µm, using known CVD-methods, this layer being the same as or different from the innermost layer.

a layer of a smooth textured $\alpha\text{-}Al_2O_3$ layer with a thickness of from about 2 to about 10 µm, and a surface roughness (Ra) of less than about 0.3 mm over a measured length of 0.25 mm.

In still another aspect of the invention, there is provided a use of a cutting tool insert as described above for side and face milling of rolled low alloyed steel at low or moderate cutting speeds.

DETAILED DESCRIPTION OF A PREFERRED EMBODIMENT OF THE INVENTION

It has now surprisingly been found that with the present invention an increased tool life can be obtained.

According to the present invention, coated cutting tool inserts particularly useful for chamfer milling of steel plates intended for oil pipes are provided comprising a cemented carbide body with a composition of from about 7.3 to about 7.9 wt % Co, preferably about 7.6 wt % Co, from about 1.0 to about 1.8 wt % cubic carbides, preferably from about 1.4 to about 1.7 wt % cubic carbides of the metals Ta and Nb and balance WC. The content of Ti is preferably on a level corresponding to a technical impurity. The average grain size of the WC is in the range of from about 1.5 to 2.5 µm, preferably about 1.8 µm and hardness from about 1500 to about 1600 HV.

The cobalt binder phase is rather highly alloyed with W. The content of W in the binder phase can be expressed as the CW-ratio=Ms/(wt % Co×0.0161), where Ms is the saturation magnetization of the cemented carbide body in $hAm^2/kg$ and wt % Co is the weight percentage of Co in the cemented carbide. The CW-value is a function of the W content in the Co binder phase. A high CW-value corresponds to a low W-content in the binder phase.

According to the present invention, an improved cutting performance is achieved if the cemented carbide body has a CW-ratio of from about 0.84 to about 0.94 preferably from about 0.86 to about 0.91.

The coating comprises a first (innermost) layer of $TiC_xN_yO_z$ with x+y+z=1, preferably z<0.5, with a thickness of 0.1-2 µm, and with equiaxed grains with size less than about 0.5 µm;

a layer of $TiC_xN_yO_z$ with x+y+z=1, preferably with z=0 and x>0.3 and y>0.3, with a thickness of from about 2 to about 10 µm, preferably from about 4 to about 7 µm, with columnar grains and with a diameter of about 5 µm, preferably less than about 2 µm;

a layer of $TiC_xN_yO_z$ with $x+y+z=1$ with $z<0.5$, preferably $z>0.1$, with a thickness of from about 0.1 to about 2 μm and with equiaxed or needlelike grains with size less than or equal to about 0.5 μm, this layer being the same as or different from the innermost layer;

an outer layer of a smooth, textured, finegrained (grain size about 1 μm) $\alpha$-$Al_2O_3$ layer with a thickness of from about 2 to about 10 μm, preferably from about 3 to about 6 μm, and a surface roughness (Ra) of less than about 0.3 mm over a measured length of 0.25 mm; and preferably a further layer of from about 0.5 to about 1.0 μm thick TiN. This outermost layer of TiN has a surface roughness $R_{max}$ less than about 0.4 μm over a length of 10 μm.

The inserts have before coating an edge radius of from about 20 to about 45 μm, preferably about 35 μm. The TiN-layer is reduced in thickness over the edge line to 50-90% of its thickness on the rake face.

In addition, the $\alpha$-$Al_2O_3$ layer has a preferred crystal growth orientation in either the (012)-, (104)- or (110)-direction, preferably in the (012)-direction, as determined by X-ray Diffraction (XRD) measurements. A Texture Coefficient, TC, is defined as:

$$TC(hkl) = \frac{I(hkl)}{I_o(hkl)} \left\{ \frac{1}{n} \sum \frac{(hkl)}{I_o(khl)} \right\}^{-1}$$

where

I(hkl)=measured intensity of the (hkl) reflection

I(hkl)=standard intensity of the ASTM standard powder pattern diffraction data n=number of reflections used in the calculation, (hkl) reflections used are: (012), (104), (110), (113), (024), (116)

According to the invention, the TC for the set of (012), (104) or (110) crystal planes is larger than about 1.3, preferably larger than about 1.5.

The invention also relates to a method whereby a cemented carbide body with a composition of from about 7.3 to about 7.9 wt % Co, preferably about 7.6 wt % Co, from about 1.0 to about 1.8 wt % cubic carbides, preferably from about 1.4 to about 1.7 wt % cubic carbides of the metals Ta and Nb and WC as the remainder with a content of Ti on a level corresponding to a technical impurity with an average grain size of the WC in the range of from about 1.5 to about 2.5 μm, preferably about 1.8 μm, a hardness of from about 1500 to about 1600 HV, a CW-ratio of from about 0.84 to about 0.94, preferably from about 0.86 to about 0.91, and before coating an edge radius of from about 20 to about 45 μm, preferably about 35 μm is coated with a first (innermost) layer of $TiC_xN_yO_z$ with $x+y+z=1$, preferably $z<0.5$, with a thickness of from about 0.1 to about 2 μm, and with equiaxed grains with size less than about 0.5 μm using known CVD-methods.

a layer of $TiC_xN_yO_z$ with $x+y+z=1$, preferably with $z=0$ and $x>0.3$ and $y>0.3$, with a thickness of from about 2 to about 10 μm, preferably about 4-7 μm, with columnar grains and with a diameter of about less than about 5 μm, preferably less than about 2 μm, deposited either by MTCVD-technique (using acetonitrile as the carbon and nitrogen source for forming the layer in the temperature range of 700-900° C.) or by high temperature CVD-technique (1000-1100° C.), the process conditions being selected to grow layers with columnar grains, that is generally high process pressure (0.3-1 bar). However, the exact conditions depend to a certain extent on the design of the equipment used and are within the purview of the skilled artisan.

a layer of $TiC_xN_yO_z$ with $x+y+z=1$ with $z<0.5$, preferably $z>0.1$, with a thickness of from about 0.1 to about 2 μm and with equiaxed or needlelike grains with size less than about 0.5 μm, using known CVD-methods, this layer being the same as or different from the innermost layer.

a layer of a smooth textured $\alpha$-$Al_2O_3$ layer with a thickness of from about 2 to about 10 μm, preferably from about 3 to about 6 μm, and a surface roughness (Ra) of less than about 0.3 mm over a measured length of 0.25 mm deposited according to U.S. Pat. No. 5,487,625, U.S. Pat. No. 5,851,687 or U.S. Pat. No. 5,766,782 and preferably a further layer from about 0.5 to about 1.0 μm thick layer of CVD- or PVD-TiN. This outermost layer of TiN has a surface roughness $R_{max}<0.4$ μm over a length of 10 μm.

The smooth coating surface is obtained by a gentle wet-blasting of the coating surface with fine grained (400-150 mesh) alumina powder or by brushing the edges with brushes based on e.g. SiC as disclosed e.g. in U.S. Pat. No. 5,861,210 if present, a TiN-layer reduced in thickness over the edge line to 50-90% of the thickness on the rake face.

When a $TiC_xN_yO_z$ layer with $z>0$ is desired, $CO_2$ and/or CO is added to the reaction gas mixture.

The invention also relates to the use of a cutting tool insert according to above for side and face milling of rolled low alloyed steel at low and moderate cutting speeds i.e. less than about 500 m/min.

The invention is additionally illustrated in connection with the following Examples which are to be considered as illustrative of the present invention. It should be understood, however, that the invention is not limited to the specific details of the Examples.

EXAMPLE 1

Cemented carbide milling inserts of special shape 32×20×8 mm in accordance with the invention with the composition 7.6 wt-% Co, 1.25 wt-% TaC, 0.30 wt-% NbC and WC as balance with average grain size of 1.8 μm, with a binder phase alloyed with W corresponding to a CW-ratio of 0.87, and an edge radius of 35 μm were coated with a 0.5 μm equiaxed TiCN-layer followed by a 5 μm thick Ti(C,N)-layer with columnar grains by using MTCVD-technique (process temperature 850° C.). In subsequent process steps during the same coating cycle, a 1 μm thick layer with equiaxed grains of $TiC_xN_yO_z$ (approx. x=0.6, y=0.2 and z=0.2) was deposited followed by a 4 μm thick layer of (012)-textured $\alpha$-Al2O3 deposited according to conditions given in U.S. Pat. No. 5,487,625. XRD-measurement showed a texture coefficient TC(012) of 1.5. After coating, the inserts were smoothed using a nylon straw brush containing SiC grains. Examination of the brushed inserts in a light optical microscope revealed that the outermost TiN-layer had been somewhat reduced in thickness.

EXAMPLE 2

Chamfer milling of low alloyed rolled steel plates in low carbon steel X70 was performed under the following conditions:

Machine: MFL Austria

Operation: Chamfer milling under dry conditions.

Work piece: Steel plates 4×12 m in 25 mm thickness.
Milling cutter: Bohlerite special cutter of diameter 800 mm.
RPM: 120 r/min
Cutting speed: 300 m/min
Feed rate/tooth: 2.5-3.0 mm
Radial depth of cut: 25 mm
Insert style: 48 pcs of special type 32×20×8
Grade 1: Inserts according to example 1.
Grade 2: Inserts from competitor A
Grade 3: Inserts from competitor B
Tool life criterion: Surface finish.
Result: Tool life number of plates

| Grade 1 | Grade 2 | Grade 3 |
|---|---|---|
| Invention | Prior art | Prior art |
| 125 plates | 78 Plates | 74 Plates |

It is apparent that 60% better tool life in number of plates compared to prior art is obtained.

Although the present invention has been described in connection with a preferred embodiment thereof, it will be appreciated by those skilled in the art that additions, deletions, modifications, and substitutions not specifically described may be made without departing from the spirit and scope of the invention as defined in the appended claims.

The invention claimed is:

1. A cutting tool insert comprising a cemented carbide body and a coating said cemented carbide body comprising WC, from about 7.3 to about 7.9 wt-% Co and from about 1.0 to about 1.8 wt-% cubic carbides of Ta and Nb, a highly W-alloyed binder phase with a CW-ratio of from about 0.86 to about 0.94, and an edge radius of from about 20 to about 45 μm, said coating comprising
   a first (innermost) layer of $TiC_xN_yO_z$ with a thickness of from about 0.1 to about 2 μm, and with equiaxed grains with size less than about 0.5 μm,
   a layer of $TiC_xN_yO_z$ with a thickness of from about 2 to about 10 μm with columnar grains with a diameter of less than about 5 μm,
   a layer of $TiC_xN_yO_z$ with a thickness of from about 0.1 to about 2 μm and with equiaxed or needlelike grains with size less than about 0.5 μm, and
   an outer layer of a smooth, textured, finegrained α-$Al_2O_3$ layer with a thickness of from about 2 to about 10 μm.

2. The cutting tool insert of claim 1 wherein the α-$Al_2O_3$ layer has a texture in the (012)-direction with a texture coefficient TC(0 12) larger than 1.3.

3. The cutting tool insert of claim 1 wherein the α-$Al_2O_3$ layer has a texture in the (104)-direction with a texture coefficient TC(104) larger than 1.3.

4. The cutting tool insert of claim 1 wherein the α-$Al_2O_3$ layer has a texture in the (110)-direction with a texture coefficient TC(110) larger than 1.3.

5. The cutting tool insert of claim 1 comprising from about 0.5 to about 1.0 μm thick layer of TiN having a surface roughness $R_{max}$<0.4 μm over a length of 10 μm and reduced in thickness over the edge line to from about 50 to about 90% of the thickness on the rake face.

6. The cutting insert of claim 1 wherein the cemented carbide contains from about 1.4 to about 1.7 wt-% carbides of Ta and Nb.

7. Method of making a cutting tool insert comprising a cemented carbide body and coating the cemented carbide body having a composition of from about 7.3 to about 7.9 wt % Co, from about 1.0 to about 1.8 wt % cubic carbides and balance WC with a content of Ti on a level corresponding to a technical impurity, the average grain size of the WC being in the range of from about 1.5 to about 2.5 μm, and hardness from about 1500 to about 1600 HV and a CW-ratio of from about 0.84 to about 0.94, and with an edge radius of from about 20 to about 45 μm comprising coating said body with
   a first (innermost) layer of $TiC_xN_yO_z$ with x+y+z=1 with a thickness of from about 0.1 to about 2 μm, and with equiaxed grains with size less than about 0.5 μm using known CVD-methods,
   a layer of $TiC_xN_yO_z$ with x+y+z=1 with a thickness of from about 2 to about 10 μm with columnar grains and with a diameter of about <5 μm, deposited either by MTCVD-technique (using acetonitrile as the carbon and nitrogen source for forming the layer in the temperature range of 700-900° C.) or by high temperature CVD-technique (1000-1100° C.), the process conditions being selected to grow layers with columnar grains,
   a layer of $TiC_xN_yO_z$ with x+y+z=1 with z0.5, with a thickness of from about 0.1 to about 2 μm and with equiaxed or needlelike grains with size less than about 0.5 μm, using known CVD-methods, this layer being the same as or different from the innermost layer, and
   a layer of a smooth textured α-$Al_2O_3$ layer with a thickness of from about 2 to about 10 μm, and a surface roughness (Ra) of less than about 0.3 mm over a measured length of 0.25 mm.

8. The method of claim 7 further providing from about 0.5 to about 1.0 μm thick layer of CVD- or PVD-TiN as outermost layer with a surface roughness $R_{max}$ less than about 0.4 μm over a length of 10 μm obtained by a gentle wet-blasting of the coating surface with fine grained alumina powder or by brushing the edges with brushes, the TiN-layer being reduced in thickness over the edge line to 50-90% of the thickness on the rake face.

9. A cutting tool insert comprising:
   a cemented carbide body; and
   a coating,
   wherein said cemented carbide body comprises WC, from about 7.3 to about 7.9 wt-% Co and from about 1.0 to about 1.8 wt-% cubic carbides of Ta and Nb, a highly W-alloyed binder phase with a CW-ratio of from about 0.86 to about 0.94, and
   wherein said coating comprises
      a first (innermost) layer of $TiC_xN_yO_z$ with a thickness of from about 0.1 to about 2 μm, and with equiaxed grains with size less than about 0.5 μm,
      a second layer of $TiC_xN_yO_z$ with a thickness of from about 2 to about 10 μm with columnar grains with a diameter of less than about 5 μm,
      a third layer of $TiC_xN_yO_z$ with a thickness of from about 0.1 to about 2 μm and with equiaxed or needlelike grains with size less than about 0.5 μm,
      an outer layer of a smooth, textured, finegrained α-$Al_2O_3$ layer with a thickness of from about 2 to about 10 μm, and
      a further layer of TiN having a surface roughness $R_{max}$<0.4 μm over a length of 10 μm, having a thickness on a rake face of from about 0.5 to about 1.0 μm and having a reduced thickness over an edge line of from about 50 to about 90% of the thickness on the rake face.

10. The cutting tool insert of claim 9, wherein the α-$Al_2O_3$ layer has a texture in the (012)-direction with a texture coefficient TC(012) larger than 1.3.

11. The cutting tool insert of claim 9, wherein the $\alpha$-$Al_2O_3$ layer has a texture in the (104)-direction with a texture coefficient TC(104) larger than 1.3.

12. The cutting tool insert of claim 9, wherein the $\alpha$-$Al_2O_3$ layer has a texture in the (110)-direction with a texture coefficient TC(110) larger than 1.3.

13. The cutting insert of claim 9, wherein the cemented carbide contains from about 1.4 to about 1.7 wt-% carbides of Ta and Nb.

14. The cutting insert of claim 9, wherein the insert has an edge radius of from about 20 to about 45 μm before coating.

15. The cutting insert of claim 14, wherein said edge radius is about 35 μm.

16. The cutting insert of claim 9, wherein said cemented carbide body comprises about 7.6 wt-% Co.

17. The cutting insert of claim 9, wherein an average grain size of the WC is in a range of from about 1.5 to 2.5 μm.

18. The cutting insert of claim 9, wherein said CW-ratio is from about 0.86 to about 0.91.

19. The cutting insert of claim 9, wherein the thickness of the second layer of $TiC_xN_yO_z$ is from about 4 to about 7 μm.

20. The cutting insert of claim 9, wherein the thickness of the outer layer of $\alpha$-$Al_2O_3$ is from about 3 to about 6 μm.

21. The cutting insert of claim 9, wherein a texture coefficient of the $\alpha$-$Al_2O_3$ layer for the set of (012), (104) or (110) crystal planes is larger than 1.5.

* * * * *